(12) United States Patent
Lee et al.

(10) Patent No.: US 6,687,154 B2
(45) Date of Patent: Feb. 3, 2004

(54) HIGHLY-INTEGRATED FLASH MEMORY AND MASK ROM ARRAY ARCHITECTURE

(75) Inventors: Peter W. Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 10/364,033

(22) Filed: Feb. 11, 2003

(65) Prior Publication Data

US 2003/0161184 A1 Aug. 28, 2003

Related U.S. Application Data

(60) Provisional application No. 60/359,696, filed on Feb. 25, 2002.

(51) Int. Cl.[7] ............................................. G11C 16/04
(52) U.S. Cl. ................................. 365/185.03; 365/185.11
(58) Field of Search ....................... 365/185.03, 185.11, 365/185.17, 185.28

(56) References Cited

U.S. PATENT DOCUMENTS 5,751,634 A * 5/1998 Itoh ....................... 365/185.17
6,226,278 B1 * 5/2001 Bursztejn et al. ........... 370/328
6,317,349 B1 * 11/2001 Wong ........................... 365/49

* cited by examiner

Primary Examiner—Vu A. Le
(74) Attorney, Agent, or Firm—George O. Saile; Stephen B. Ackerman; Douglas R. Schnabel

(57) ABSTRACT

A memory cell device is achieved. The memory cell device comprises a first transistor having gate, drain, and source. A second transistor has gate, drain, and source. The first transistor drain is coupled to an array bit line. The second transistor source is coupled to an array source line. The first transistor source is coupled to the second transistor drain. The first transistor and the second transistor comprise one Flash transistor and one mask ROM transistor. The programmed state of the mask ROM transistor can be read.

36 Claims, 12 Drawing Sheets

|  | selected cells | 20a | 20b | 21 | 22 | 23 |
|---|---|---|---|---|---|---|
| Erase | M21a, M22a | Vpp | 0V | 0V | 0V | 0V |
| Program | M21a | Vnn | 0V | Vpp | 0V | 0V |
| Read | M21a | Vread | 0V | 1V | 0V | 0V |

TABLE. 1 (Prior Art)

| | selected cells | 30a | 30b | 30c | 30d | 31 | 32 | 33 |
|---|---|---|---|---|---|---|---|---|
| Erase | M31a, M32a | Vnn | Vpp | 0V | 0V | Vpp | Vpp | Vpp |
| Program | M31a | Vpp | Vmn | 0V | 0V | Vmn | 0V | 0V |
| Read | M31a | Vread | Vpass | 0V | 0V | 1V | 0V | 0V |
| | M31b | Vpass | Vread | 0V | 0V | 1V | 0V | 0V |

TABLE. 2 (Prior Art)

| | selected cells | 40a | 40b | 40c | 40d | 41 | 42 | 43 |
|---|---|---|---|---|---|---|---|---|
| Erase | M41a, M42a | Vpp | 0V | 0V | 0V | 0V | 0V | 0V |
| Program | M41a | Vnn | 0V | 0V | 0V | Vmp | 0V | 0V |
| Read | M41a | Vread | Vpass | 0V | 0V | 1V | 0V | 0V |
| Read | M41b | Vpass | Vread | 0V | 0V | 1V | 0V | 0V |

TABLE. 3

| | selected cells | 50a | 50b | 50c | 50d | 51 | 52 | 53 |
|---|---|---|---|---|---|---|---|---|
| Erase | M51b, M52b | Vpp | 0V | 0V | 0V | 0V | 0V | 0V |
| Program | M51b | Vmp1 | Vnn | 0V | 0V | Vmp2 | 0V | 0V |
| Read | M51a | Vread | Vpass | 0V | 0V | 1V | 0V | 0V |
| Read | M51b | Vpass | Vread | 0V | 0V | 1V | 0V | 0V |

TABLE. 4

|  | selected cells | 60a | 60b | 60c | 60d | 61 | 62 | 63 |
|---|---|---|---|---|---|---|---|---|
| Erase | M61a, M62a | Vpp | 0V | 0V | 0V | 0V | 0V | 0V |
|  | M61b, M62b | 0V | Vpp | 0V | 0V | 0V | 0V | 0V |
| Program | M61a | Vnn | Vmp1 | 0V | 0V | Vmp2 | 0V | 0V |
|  | M61b | Vmp1 | Vnn | 0V | 0V | Vmp2 | 0V | 0V |
| Read | M61a | Vread | Vpass | 0V | 0V | 1V | 0V | 0V |
|  | M61b | Vpass | Vread | 0V | 0V | 1V | 0V | 0V |

TABLE. 5

HIGHLY-INTEGRATED FLASH MEMORY AND MASK ROM ARRAY ARCHITECTURE

This application claims priority to U.S. Provisional Application Ser. No. 60/359,696 filed on Feb. 25, 2002, and herein incorporated by reference.

BACKGROUND OF THE INVENTION (1) Field of the Invention

The invention relates to digital memory devices and, more particularly, to a highly-integrated, Flash memory and mask ROM array architecture.

(2) Description of the Prior Art

In many electronic applications, it is desirable to combine more than one type of memory on one chip to reduce the cost and to increase the performance. One of the most popular and widely used single-chip combinations is flash memory and ROM.

Referring now to FIG. 1A, a conventional architecture for a memory card with security function is shown. This type of memory card is a passive device. Data may be stored in the card and may be changed during a card read operation. Passive memory cards of this type are widely used for phone card, health insurance card, vending machine card, and car parking card applications. The memory card contains address and security logic 11 to insure secure data exchange, a ROM array 12 to store the security code and data, a Flash or EEPROM array 13 to store the variable data, and I/O logic 14 to perform the data interface.

Referring now to FIG. 1B, a conventional architecture for a microprocessor card, or 'smart card', is shown. A smart card typically contains an 8-bit to 32-bit MCU or central processing unit (CPU) 15. Some smart cards contain digital signal processors (DSP) to do data storage, management, processing and user interface. The smart card can support one application or multiple applications according to the stored application program run on the MCU. Typically, the smart card software can be freely programmed. Some smart cards even provide an open application program interface to allow new program code to be downloaded. Therefore, the functionality of the smart card is not restricted. One example for the smart card application is the mobile phone card.

The smart card shown contains a CPU 15 to perform the data processing, a RAM array 10 to act as working memory for temporary data storage, a ROM array 12 for storing the operating system, a Flash or EEPROM array 13 to store the variable data, and I/O logic 14 to perform the data interface.

Some of these prior art applications use a flash memory and a ROM on one chip. However, the Flash and ROM arrays are implemented as two discrete arrays. A large amount of chip area is wasted because array access circuitry, signal bus, and data bus must be duplicated for each type of memory array. Thus, it is highly desirable to further integrate the Flash memory and the ROM into one array. This will result in a highly cost-effective system on chip (SOC).

Flash memory is widely used, especially for portable applications, because of its non-volatility and in-system reprogrammability. The basic Flash memory cell structure consists of a control gate, a floating gate, source, and drain. The source and drain are two heavily doped regions on a silicon substrate. A channel exists for electrons to flow from drain to source. The floating gate is located between the control gate and channel. The floating gate is isolated by a thin-tunnel oxide layer and by a dielectric layer. The thin tunnel oxide layer exists between the floating gate and channel. The dielectric material is located between the control and floating gates. The insulators around the floating gate enable electrons to be trapped.

By biasing the control gate, drain, and source with proper voltages, electrons can move in to or out of the floating gate through the tunnel oxide layer. If the electrons move between the channel and floating gate, this operation is considered a 'channel-operation.' An 'edge-operation', in contrast, is defined as electrons moving between the floating gate and the edge of the source or drain.

Increasing the number of electrons raises the cell's threshold voltage. The threshold voltage is the voltage needed to allow current to flow. The threshold voltage shifts depending on the amount of charged trapped in the floating gate. Therefore, injecting or removing electrons can be used as means to store data. Two different operations are used for changing the Flash memory cell threshold voltage. The erase operation is applied to a large number of cells called a 'block'. Erasing will collectively change the cell threshold voltage to a high or a low threshold voltage. The program operation is performed on a smaller number of cells called a 'page'. Programming changes each cell threshold voltage depending on the desired data. Various mechanisms and technologies are used for erasing and programming different types of Flash memories. In this present invention, the well-known, Fowler-Nordheim (F-N) tunneling mechanism is chosen as an example.

A memory array consists of a plurality of cells arranged in columns and rows. The control gates of the cells in each row are connected to form word lines. The sources and drains of the cells in a column are connected to form source and bit lines. A cell can be read, erased, and programmed in this array by applying proper bias conditions to the word lines and bit lines.

Referring now to FIG. 2, a prior art, NOR-type Flash memory array is illustrated. A small array is shown comprising two word lines 20a and 20b, and two bit lines 21 and 22, and four memory cells M21a, M21b, M22a, and M22b. This type of memory array is suitable for high-speed applications because the bit lines 21 and 22 can be formed using a metal layer having a very short bit line, delay time. Therefore, this type of Flash array is suitable for use in embedded, smart card, or SOC applications as mentioned above.

However, this prior art has several significant disadvantages in embedded applications. Each cell structure M21a contains one transistor and is called a '1T cell.' This type of 1T cell is susceptible to an over-erase condition. In an over-erase condition, the threshold voltage ($V_{th}$) of a Flash transistor becomes negative during the erase operation. An over-erased cell will not completely turn OFF when the control gate bias is in the OFF state. The presence of an over-erased Flash cell on a bit line will cause bit line leakage current. Read errors will occur due to this leakage.

To prevent over-erase problems, an additional operation must be performed following the erase operation. A correction operation is performed in order to eliminate the over-erased cells. The correction operation is equivalent to a soft-program operation to increase the $V_{th}$ of over-erased cells back to a positive range. This correction must be performed on a bit-by-bit basis to prevent overshooting the desired $V_{th}$ range. Therefore, the correction operation is complex and requires a complicated state machine. In addition, the correction operation significantly slows the re-write cycle of the Flash memory cells and is, therefore, not suitable for the above-described, embedded applications.

An additional problem with the 1T cells of the prior is handling high voltage. During programming, a high voltage signal must be applied to the bit lines. This high voltage will be coupled to the floating gate by the junction-floating gate overlapping area. This cell will turn ON slightly and create bit line current leakage. Each bit line contains a huge number of cells, and, in page-programming mode, a large number of bit lines will be programmed together. Therefore, the lump sum of leakage currents can be substantial. The high voltage signal applied to the bit lines is generated by on-chip, charge pump circuitry. The charge pump circuit is limited in current capability and may not be able to sustain the large leakage current during programming. If the leakage current is too large, the high voltage signal will drop in voltage and cause very slow programming times.

Referring now to FIG. 3, another prior art discloses a two transistor (2T) structure to eliminate the over-erase problem. The 2T cell M31 contains a floating-gate, Flash cell M31$a$ and a select transistor M31$b$. The select transistor M31$b$ is an enhancement NMOS, having a positive $V_{th}$ of, for example, +0.7V. The select transistor M31$b$ can be completely turned OFF. Therefore, if the Flash cell M31$a$ is over-erased to a negative $V_{th}$, the select transistor M31$b$ will block bit line current such that the overall 2T cell M31 will not conduct leakage current. In addition, because the floating gate cell M31$a$ can be over-erased without causing excessive bit line current, the acceptable $V_{th}$ range for the floating gate cell M31$a$ is extended from a positive value of, for example, +5V, to a negative value of, for example, −1V. A negative $V_{th}$ results in high current during read operation and is suitable for high-speed embedded applications. In addition, because over-erase is not a concern, a single pulse programming and erasing method can be used. The pulse width is properly chosen to guarantee sufficient erasing or programming to bring the cell $V_{th}$ to a desired level during the pulse time. A single pulse approach can save significant time and power when compared to conventional erase-and-verify or program-and-verify iterations. These iterations are necessary for the conventional 1T flash cell because of over-erase concerns.

One drawback for the 2T cell is its relatively larger cell size. Compared with the 1T cell, the 2T cell comprises an increase in cell size of between about 40% and 50% due to the extra select transistor. The larger cell size significantly increases the array area and is less cost-effective.

SUMMARY OF THE INVENTION

A principal object of the present invention is to provide an effective and manufacturable memory device.

A further object of the present invention is to provide a memory device having a highly integrated array of Flash cells and mask ROM cells.

A yet further object of the present invention is to eliminate over-erase problems by integrating a mask ROM transistor with a Flash transistor to create a novel 2T cell.

Another yet further object of the present invention is to double the memory density by integrating a mask ROM transistor with a Flash transistor.

Another further object of the present invention is to provide a highly integrated Flash cell and mask ROM cell array that is compatible with a range of programming and erasing mechanisms.

Another further object of the present invention to provide a memory device comprising a 2T cell using two Flash transistors.

Another further object of the present invention is to provide a system based on a highly integrated, Flash and mask ROM 2T cell.

In accordance with the objects of this invention, a memory cell device is achieved. The memory cell device comprises a first transistor having gate, drain, and source. A second transistor has gate, drain, and source. The first transistor drain is coupled to an array bit line. The second transistor source is coupled to an array source line. The first transistor source is coupled to the second transistor drain. The first transistor and the second transistor comprise one Flash transistor and one mask ROM transistor. The programmed state of the mask ROM transistor can be read.

Also in accordance with the objects of this invention, a memory cell device is achieved. The memory cell device comprises a first Flash transistor having control gate, flash gate, drain, and source. A second Flash transistor has control gate, flash gate, drain, and source. The first Flash transistor drain is coupled to an array bit line. The second Flash transistor source is coupled to an array source line. The first Flash transistor source is coupled to the second Flash transistor drain.

Also in accordance with the objects of this invention, a device is achieved. The device comprises a memory array comprising a plurality of memory cell devices. The memory cell devices comprise a first transistor having gate, drain, and source. A second transistor has gate, drain, and source. The first transistor drain is coupled to an array bit line. The second transistor source is coupled to an array source line. The first transistor source is coupled to the second transistor drain. The first transistor and the second transistor comprise one Flash transistor and one mask ROM transistor. Finally an access controller is included that is capable of accessing the memory array.

Also in accordance with the objects of this invention, a device is achieved comprising a memory array further comprising a plurality of memory cell devices. The memory cell devices comprise a first transistor having gate, drain, and source. A second transistor has gate, drain, and source. The first transistor drain is coupled to an array bit line. The second transistor source is coupled to an array source line. The first transistor source is coupled to the second transistor drain. The first transistor and the second transistor comprise one of the group consisting of: one Flash transistor and one mask ROM transistor, two Flash transistors, and two mask ROM transistors. Finally, an access controller is included that is capable of accessing the memory array.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a highly-integrated memory array comprising Flash cells and mask ROM cells. The novel device is a 2T cell comprising a Flash cell and a mask ROM cell. Alternatively, the 2T cell may comprise two Flash transistors. The novel, 2T cell eliminates the over-erase problem by providing a switch to turn OFF bit line current in each cell. In addition, the second transistor also provides a second bit of memory that can be accessed. A system is disclosed that uses the novel, 2T cell of the present invention. It should be clear to those experienced in the art that the present invention can be applied and extended without deviating from the scope of the present invention.

The present invention provides a novel approach to achieve much higher integration over the prior art. In addition, the present invention provides a novel approach to integrate an AND-type or a Dual-String-NOR-type Flash memory array with a Mask ROM array having a density double that of the original Flash memory area without any area penalty. Moreover, this invention provides a novel approach to integrate a Flash memory and a Mask ROM in one chip without a major process change. Thus, this invention provides an ideal solution for Smart Card applications or System-On-Chip (SOC) applications that generally require integration of a Flash memory and a Mask ROM in single chip.

Figure 1A:
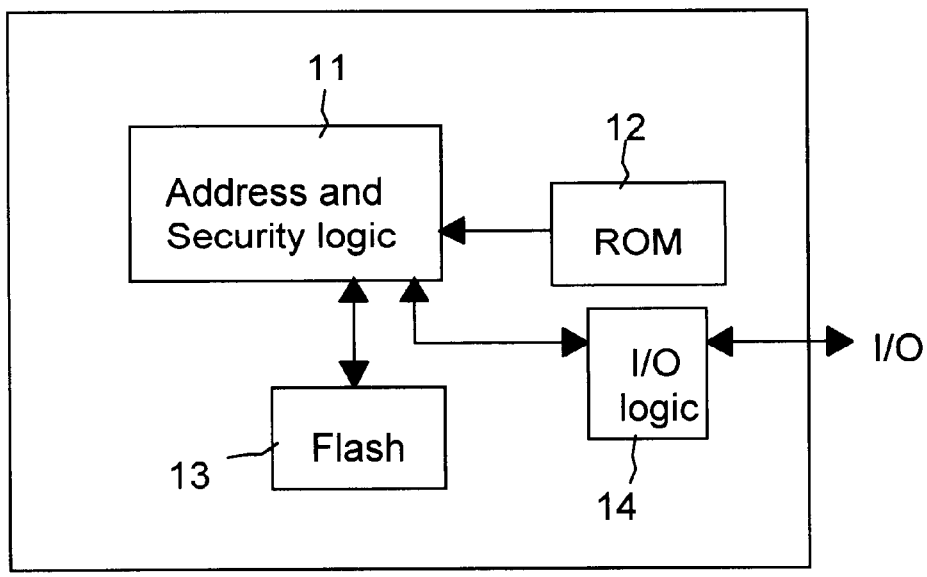
FIG. 1A illustrates a conventional architecture for a memory card with security function.
Figure 1B:
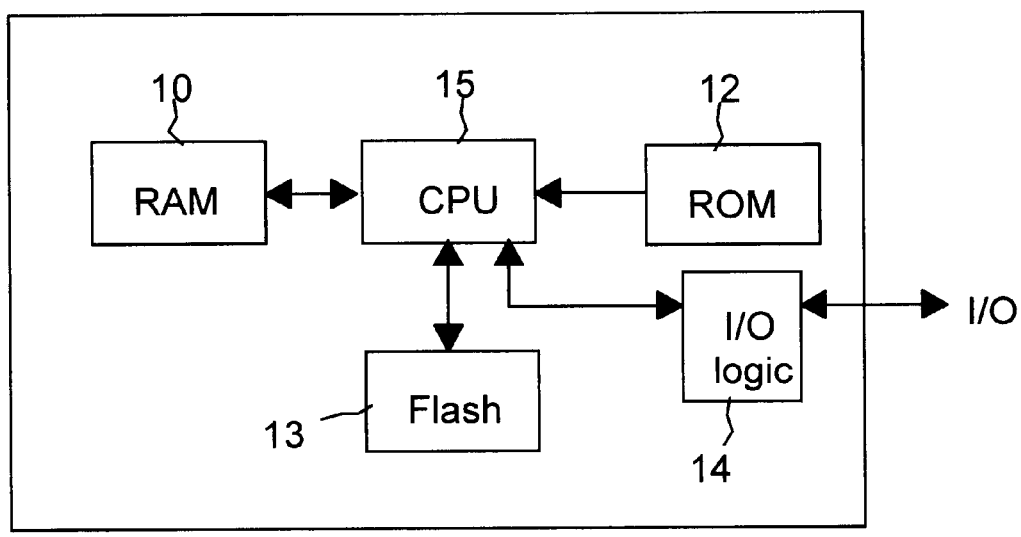
FIG. 1B illustrates a conventional architecture for a microprocessor card, or 'smart card.'
Figure 2:
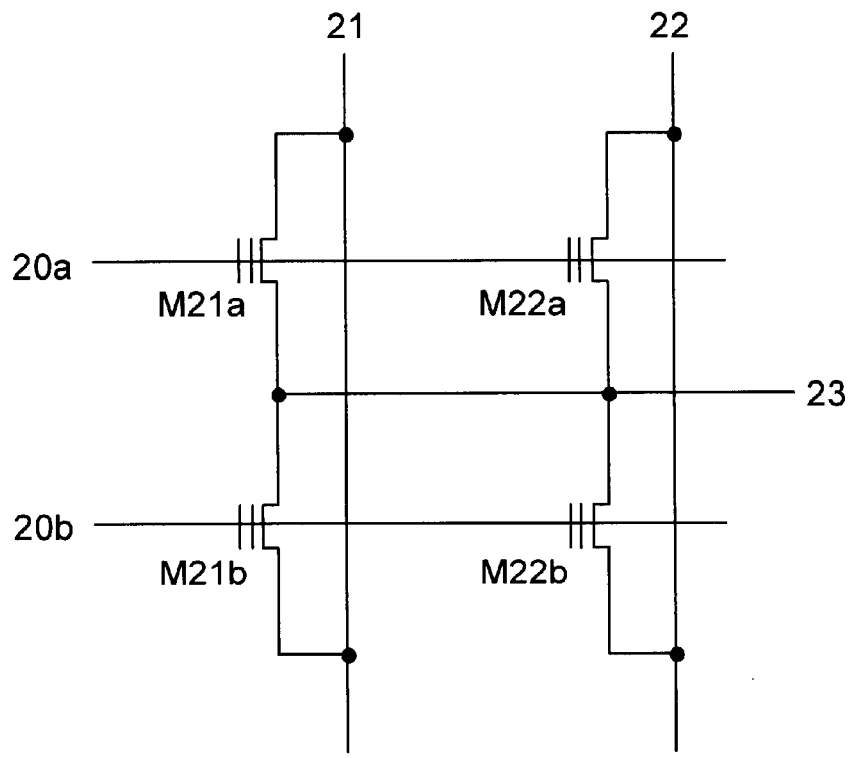
FIG. 2 and TABLE 1 illustrate a prior art, NOR-type Flash memory array.
Figure 3:
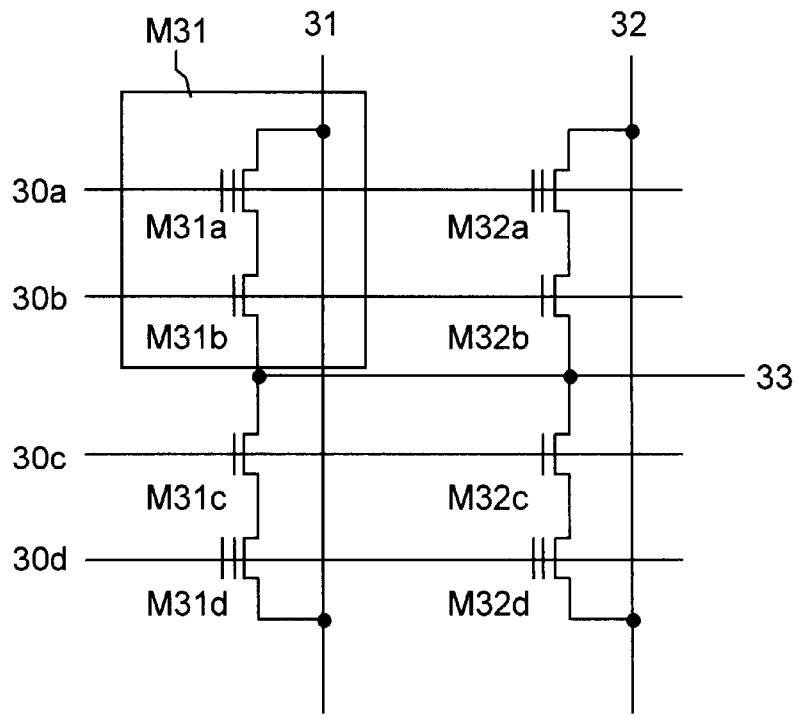
FIG. 3 and TABLE 2 illustrate a prior art disclosing a two transistor (2T) structure to eliminate the over-erase problem.
Figure 4:
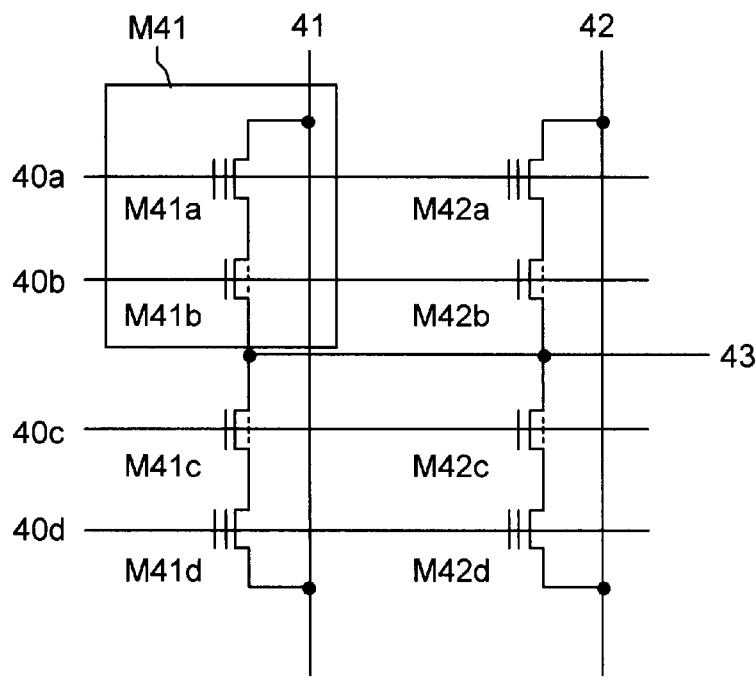
FIG. 4 and TABLE 3 illustrate a first preferred embodiment of the novel, 2T cell structure of the present invention.

Referring now to FIG. 4, a first preferred embodiment of the novel, 2T cell structure of the present invention is illustrated. The cell M41 comprises a 2T structure further comprising a first transistor M41a and a second transistor M41b. As discussed above, the conventional 2T cell contains a floating gate cell and a select transistor. However, this novel 2T cell structure M41 comprises a floating gate cell (M51a) and a 'Mask ROM' cell (M41b).

More specifically, the memory cell device M41 comprises a first transistor M41a having gate, drain, and source. A second transistor M41b has gate, drain, and source. The first transistor M41a drain is coupled to an array bit line 41. The second transistor M41b source is coupled to an array source line 43. The first transistor M41a source is coupled to the second transistor M41b drain. The first transistor M41a and the second transistor M41b comprise one Flash transistor M41a and one mask ROM transistor M41b. As will be discussed below, the order of the first transistor M41a and the second transistor M41b can be reversed.

The mask ROM transistor M41b performs the dual functions of eliminating the over-erase problem and of storing data. The mask ROM transistor M41b is preferably fabricated to have a positive $V_{th}$ of between about +1V for low-$V_{th}$ to represent data '1' and about +4V for high-$V_{th}$ to represent data '0'. Therefore, the mask ROM transistor can perform the select transistor function to block bit line current even if the Flash transistor M41a is over-erased. In addition, the Mask ROM transistor M41b can store a data bit. Therefore, each 2T cell M41 can store two data bits: one in the Flash transistor M41a and one in the mask ROM transistor M41b.

The data bit in the Flash transistor M41a can be electrically changed, in-system, by using an on-chip, high-voltage generator. The mask ROM transistor M41b data bit is permanently encoded during fabrication by an ion implantation controlled by a masking pattern. Consequently, this 2T cell M41 stores one in-system, alterable data bit in the flash transistor M41a, and another, foundry-alterable, data bit in the mask ROM transistor M41b. By comparison, the conventional 2T cell can store only one data bit in the Flash transistor. The select transistor is not capable of data bit storage. Therefore, the novel 2T cell structure M41 of the present invention doubles the memory density—one half in Flash memory form, and one half in mask ROM form—without increasing area. A very cost-effective memory device is thereby achieved.

Another advantage of the novel cell structure of the present invention is that it combines both Flash array and mask ROM array in the same density of the conventional flash array. This function is convenient and provides high performance for system-on-chip designs. For many applications, it is highly desirable to combine both Flash arrays and mask ROM arrays in one chip, called a 'combo-chip.' One of the major combo-chip applications is the smart card. A smart card typically comprises a mask ROM array, having a size of between 8K Byte and 32K Byte, that is used to store the card operating system. A Flash array or an EEPROM array, having a size of between 2K Byte and 32K Byte, is used to store variable data such as an account number. In such an application, the conventional architecture uses two, discrete arrays: one Flash array and one mask ROM array. In the present invention, the novel cell structure combines the mask ROM array and the Flash array into a single array that comprises the size of a 2T Flash-only array. This is a significant cost and convenience advantage for the present invention.

Referring now to TABLE 3, exemplary operating conditions for the first preferred embodiment of the present invention are illustrated. For Flash memories, there are several mechanisms and conditions that can be used for erase, program, and read operations. The novel cell structure M41 of the first preferred embodiment of the present invention is not restricted to a single mechanisms or condition. The cell structure is suitable for any of the erase, program, and read mechanisms and conditions that are well-known in the art. However, due to the low power consumption requirements in many embedded applications, a Fowler-Nordheim (F-N) tunneling mechanism will be described. The F-N tunneling mechanism is known and widely used in today's Flash memory due to its extremely low operating current of between about 100 pA and 10 nA per cell. The F-N mechanism is therefore particularly useful for large page size erasing and programming.

The exemplary cell M41 array architecture features page-selectable erasing and bit-selectable programming operation. During an erase operation of a page containing the Flash cells M41a and M42a, a positive, high voltage $V_{pp}$ is applied to the selected word line 40a. The positive, high voltage $V_{pp}$ is preferably about +12V. A low voltage of, for example, 0V, or a negative voltage of, for example, −5V, is applied to the selected bit lines 41 and 42. These bias conditions will cause electrons to be transferred, by F-N tunneling, from channels to the floating gates in the selected Flash cells M41a and M42a. The $V_{th}$ of the selected cells M41a and M42b will be increased to erase each cell to a data bit '0'.

During a program operation, a negative high voltage Vnn of, for example, −8V is applied to the selected word line 40a. A positive, medium-high voltage $V_{mp}$ of preferably about +5V is applied to the selected bit line 41. These bias conditions causes electrons to transfer, by F-N tunneling, from the floating gate to the bit line junction in the selected cell M41a. The $V_{th}$ of the selected cell M41a is thereby decreased and a data bit '1' is programmed. Meanwhile, a low voltage of about 0V is applied to the deselected bit line 42. The voltage difference between the bit line 42 and the word line 40a on the deselected cell M42a is not sufficient to induce F-N tunneling. Therefore, cell M42a is not programmed. Proper bias conditions are selected and applied to other word lines and bit lines to create non-programming conditions.

As an important point, the exemplary bias conditions as shown in TABLE.3 show the other word lines 40b, 40c, 40d, and the source line 43 as being grounded (0V). In practice, however, other bias conditions can be applied to improve the operating condition. For example, during program operation, a negative, high voltage (−8V) may be applied to the selected cell M41a word line 40a and a positive, high voltage (+5V) may be applied to the bit line 41. These conditions may cause the selected cell M41a to experience a severe, channel punch-through condition. To reduce the chance of channel punch-through voltage in the selected cell M41a, a relatively low voltage of about +2V may be applied to the source junction of the selected cell M41a through the source line 43. A relatively higher voltage of about +3V is applied to the word line 40b to charge the source junction of the selected cell M41a to approximately +2V. This can significantly reduce the punch-through voltage of the selected cell M41a. However, this relatively low voltage, +2V, will be also charged to the source of the deselected cell M42a, due to the common word line 40b and the common source line 43, and may cause some disturb problems.

To overcome this potential problem, a dynamic pre-charge scheme can be used. In a dynamic pre-charge scheme, the selected word line 40a is applied with a relatively high voltage (+5V) at the beginning of program operation. This high word line voltage will cause both the selected cell M41a and deselected cell M41b to turn ON. Next, a relative low voltage (+2V) and a ground level (0V) are applied to the selected bit line 41 and to the deselected bit line 42, respectively. These voltages will pass to the sources of the selected cell M41a and of the deselected cell M41b. Next, the negative, high voltage (−8V) is applied to the word line 40a, and the positive, high voltage (+5V) is applied to the selected bit line 41 for programming. Because both the selected cell M41a and deselected cell M41b are turned OFF by the negative, word line 40a voltage, their sources will trap the pre-charged voltages of +2V and 0V, respectively. Consequently, the punch-through stress on the selected cell M41a is reduced without causing any disturbance to the deselected cell M41b. As will be clear to those skilled in the art, there are other ways to implement the bias conditions for the erase, program, and read operations for the disclosed novel cell structure of the present invention. The disclosed cell structure can be used with any proper bias conditions and does not have any constraint to any type of conditions.

During a read operation, a proper bias voltage of, for example, +1V is applied to the selected bit line 41 and is further coupled to a current sense amplifier circuit through the selection of bit line decoding circuitry. A relatively low voltage of, for example, 0V is applied to the selected source line 43. The data bit of either transistor M41a and M41b can be individually read. To read the Flash cell M41a, a proper voltage ($V_{read}$) is applied to the selected word line 40a. This $V_{read}$ voltage has to be able to distinguish the Flash cell $V_{th}$ level. Since the present invention eliminates concerns regarding the over-erase condition, the Flash cell can have a negative $V_{th}$. As an example of preferred $V_{th}$ levels for a Flash cell storing binary data, $V_{th}$ higher than +2V would represent data '0', and $V_{th}$ lower than −1V would represent data '1'.

To read the Flash cell M41a, a voltage in between −1V and +2V, such as 0V, can be applied to the selected word line 40a to check the selected cell M41a $V_{th}$ level. If the $V_{th}$ belongs to low $V_{th}$ region, Flash transistor M41a will be turned ON and conduct about 30 uA to 50 uA of current. Otherwise, Flash transistor M41a will be turned OFF and conduct no channel current. It should be noted that this $V_{th}$ distribution is only an example. In practice, the Flash cell $V_{th}$ levels can be positive values for both low $V_{th}$ and high $V_{th}$, or negative values for both low $V_{th}$ and high $V_{th}$, or a negative value for low $V_{th}$ and a positive value for high $V_{th}$.

During the read operation on the Flash cell M41a, the mask ROM cell M41b must be turned ON to allow channel current to flow from the bit line 41 to the source line 43. Therefore, a proper high voltage ($V_{pass}$) is applied to the word line 40b to turn ON the mask ROM cell M41b even if the mask ROM cell M41b has a high $V_{th}$. For example, the Mask ROM cell M41b $V_{th}$ may range from about +1V for a low $V_{th}$ to about +4V for high $V_{th}$. A $V_{pass}$ word line 40b voltage of, for example, +5V would guarantee turn-ON of both the high-$V_{th}$ and low-$V_{th}$ Mask ROM cells to allow the channel current to flow.

To read the mask ROM cell M41b, a proper high voltage ($V_{pass}$) is applied to the Flash cell M41a word line 40a to guarantee that the Flash transistor M41a is turned ON regardless of the Flash cell $V_{th}$. Channel current is thereby allowed to flow from the bit line 41 to the source line 43. The word line 40a voltage, $V_{pass}$, has to be higher than the Flash cell's highest $V_{th}$ plus some margin. In the above example, the Flash cell's high $V_{th}$ is around +2V, thus $V_{pass}$ could be about +3V to +4V.

All the $V_{th}$ distributions and voltages applied to the word lines, bit lines, and source lines in the above description are exemplary. Other values can be used and remain within the scope of the disclosure of the present invention.

The $V_{th}$ values for the mask ROM transistors can be adjusted by using different types of impurity doses in the of ROM code ion implantation process step. For example, the Mask ROM cell $V_{th}$ can be increased by implanting a P-type impurity such as boron. On the other hand, using an N-type impurity such as phosphorus in ROM code implant will cause $V_{th}$ to decrease.

It is also important to note that, during the above erase, program, and read operations, the source and drain junction of both the selected and deselected mask ROM cells M41a and M42a are always forced to a low voltage. The bit line high voltage is only applied to the drain of the selected Flash cell M41a during programming. The mask ROM cells M41a and M42a can be short-channel devices since the drain-to-source voltage is kept low. This significantly reduces the device size of the mask ROM cell, as well as the process complexity.

Although the above example shows the Flash cell $V_{th}$ being increased during erase operation and decreased during program operation, it is obvious that these operations can be reversed. The Flash cell $V_{th}$ may be decreased by erasing and increased by programming. In addition, the above-discussed conditions show erasing operations using F-N tunneling through the channel region and programming operations using F-N tunneling through the drain region. However, the invention has no constraint on the erase and program mechanism and bias conditions. Any other applicable mechanism and bias condition could be utilized within the scope of the present invention. For example, programming could be performed using F-N tunneling through the selected cells' channel region. Alternatively, programming could be performed using Channel-Hot-Electron (CHE) injection in the drain side or in the source side of the selected cell. Channel-Initiated-Secondary-Electron (CHISEL) injection in the drain side or in the source side of the selected cell could be used for programming. An alternative erasing mechanism is F-N tunneling in the drain side or in the source side of the selected cell. Finally, F-N tunneling between the word line (control gate) and the floating gate of the selected Flash cell may be used as the erasing mechanism.

Figure 5:
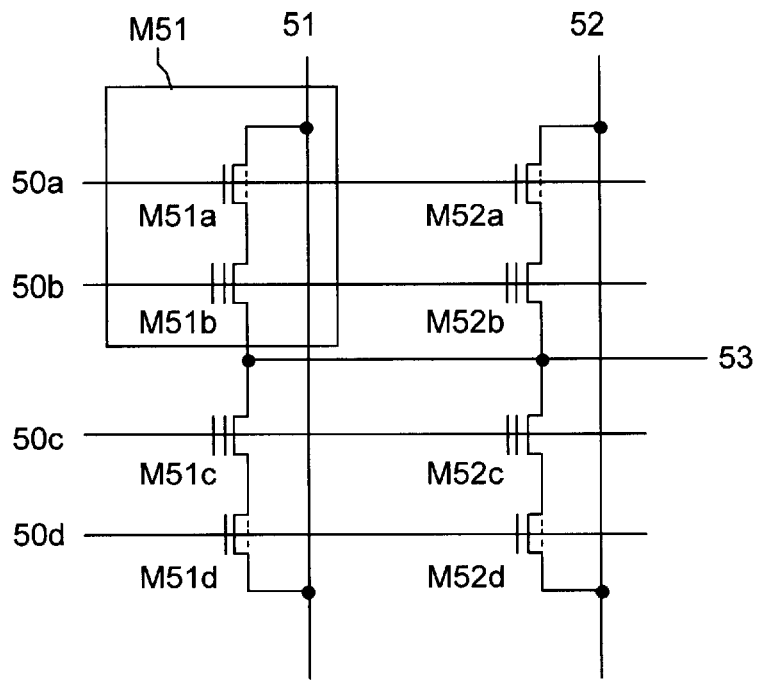
FIG. 5 and TABLE 4 illustrate a second preferred embodiment of the cell structure according to the present invention.

Referring now to FIG. 5, a second preferred embodiment of the cell structure according to the present invention is illustrated. The cell M51 again comprises a 2T structure M51a and M51b. However, in the second embodiment the Flash cell M51b is located near the source line side and the Mask ROM cell M51a is located near the bit line side.

TABLE.4 shows exemplary operating conditions for the second embodiment cell structure M51 of the present invention. The exemplary cell array architecture features page-selectable erasing and bit-selectable programming operation. During the erase operation, the selected word line 50b is driven to a positive, high voltage $V_{pp}$ of, for example, about +12V, and the selected bit lines 51 and 52 are driven to a low voltage of, for example, about 0V or to a negative voltage of, for example, about −5V. These bias conditions will cause electrons to be transferred, by F-N tunneling, from the channel regions to the floating gates of selected cells M51b and M52b. The $V_{th}$ of the cells is increased to program data bit '0'.

During programming, the selected word line 50b is driven to a negative high voltage $V_{nn}$ of, for example, about −8V, and the selected bit line 51 is driven to a positive, medium-high voltage $V_{mp2}$ of, for example, about +5V. The word line 50a for the mask ROM cell M51a is driven to a proper voltage $V_{mp1}$ of, for example, about +10V to thereby pass the bit line voltage to the drain of the selected Flash cell M51a. These bias conditions will cause electrons to transfer, by F-N tunneling, from the floating gate to the drain junction of the selected cell M51b of the cell. The selected cell M51b $V_{th}$ is decreased to a data bit '1.' At the same time, the deselected bit line 52 is driven to a low voltage of, for example, 0V that will be coupled to the drain of the deselected cell M52b. The voltage difference between the bit line 52 and the word line 50b is not sufficient to induce F-N tunneling mechanism. Therefore, the deselected cell M52b is inhibited from being programmed.

Note that the exemplary bias conditions in TABLE.4 show that the other word lines 50c and 50d, and the source line 53 are grounded with 0V. In practice, however, other bias conditions could be applied to improve the operating condition. For example, during programming, the selected cell M51b word line 50a could be driven to a negative, high voltage of, for example, about −8V, and the drain of the selected cell M51b could be driven to a positive, high voltage of, for example, about +5V. These conditions may cause a severe channel punch-through condition for the selected cell M51b. To reduce the selected cell M51a drain-to-source voltage, a relatively low voltage of, for example, +2V may be applied to the source line 53. This relatively low voltage, +2V, may slightly disturb the deselected cell M52b. However, because the source voltage is low, any cell disturbance problem can be solved by properly choosing the cell $V_{th}$ and operating margin.

From the above description, it is obvious that there is not one single way to implement the bias conditions for the erase, program, and read operations for the second preferred embodiment of the present invention. Other bias conditions could be used. For example, programming may comprise F-N tunneling through the selected cell channel region. Programming may comprise Channel-Hot-Electron (CHE) injection in the drain side or in the source side of the selected cell. Yet another approach is to program using Channel-Initiated-Secondary-Electron (CHISEL) injection in either the drain side or in the source side of the selected cell. Erasing may be performed using F-N tunneling in the drain side or in the source side of the selected cell. Finally, erasing may comprise F-N tunneling between the word line (control gate) and the floating gate of the selected cell.

The second preferred embodiment cell may be read using techniques similar to those used in the first embodiment cell. For example, the selected bit line 51 is driven to a proper bias voltage of, for example, about +1V and is coupled to a current sense, amplifier circuit through the selection of bit line decoding circuitry. The selected source line 53 is driven to a relatively low voltage of, for example, about 0V. Once again, both the Flash cell M51b and the mask ROM cell M51a can be read individually.

To read the Flash cell M51b, a proper voltage $V_{read}$ is applied to the selected word line 50b. This $V_{read}$ voltage has to be able to distinguish the Flash cell $V_{th}$ level. Since the over-erase condition can be ignored, the Flash cell can be allowed to have a negative $V_{th}$. Preferred $V_{th}$ levels for a Flash cell storing binary data are a $V_{th}$ higher than about +2V representing data bit '0' and a $V_{th}$ lower than about −1V representing data bit '1'. For these $V_{th}$ levels, a voltage between about −1V and +2V can be applied to the selected word line 50b to check the selected cell M51a $V_{th}$ level. If the cell has a low $V_{th}$, then it will be turned ON and conduct between bout 30 uA and 50 uA of current. If the cell has a high $V_{th}$, then it will be turned OFF and will conduct no channel current. This $V_{th}$ distribution is only an example. The Flash cell $V_{th}$ can range between positive values for both low $V_{th}$ and high $V_{th}$, or between negative values for both low $V_{th}$ and high $V_{th}$, or between a negative value for low $V_{th}$ and a positive value for high $V_{th}$.

To read the Flash cell M51b, the mask ROM cell M51a has to be turned ON to allow channel current to flow from the bit line 51 to the source line 53. Therefore, the word line 50a is driven to a proper high voltage ($V_{pass}$) to turn ON the mask ROM cell M51a regardless of the $V_{th}$ of the mask ROM cell M51a. For example, if the mask ROM cell M51a $V_{th}$ ranges between about +1V for low $V_{th}$ and about +4V for high $V_{th}$, then a word line 50a voltage of about +5V would turn ON the mask ROM cell regardless of the $V_{th}$ condition.

To read the mask ROM cell M51a a proper high voltage ($V_{pass}$) is applied to the Flash cell M51b word line 50b to turn ON the Flash cell and to allow the mask ROM cell M51a channel current to flow from the bit line 51 to the source line 53. To insure that the Flash cell will be turned ON, the word line 50b voltage $V_{pass}$ must be higher than the highest $V_{th}$ plus some margin. In the above example, the Flash cell high $V_{th}$ is around +2V. Therefore, $V_{pass}$ could be between about +3V and +4V. To read the mask ROM cell M51a, the word line 50a is driven to a proper voltage ($V_{read}$) between a low $V_{th}$ of about +1V and a high $V_{th}$ of about +4V. A $V_{read}$ of, for example, about +3V could be used to check if the Mask ROM cell (M51a) is turned ON or OFF.

The second preferred embodiment has an advantage over the first preferred embodiment. By reversing the locations of the mask ROM cell M51a and the Flash cell M51b, bit line disturbance of deselected word lines cells during program operation can be minimized. The mask ROM cells on deselected word lines are turned OFF to thereby isolate their corresponding Flash cells from the bit line. The bit line program voltage of, for example, about +5V will not cause any disturb to the Flash cells on deselected word lines. However, in order to sustain the bit line high voltage, the mask ROM cell may require a long channel layout in order to increase the mask ROM cell, breakdown voltage. In the current technology, the mask ROM cell gate-aided, junction breakdown voltage is around 5V for the worst case of a high $V_{th}$ cell. This breakdown voltage is suitable for the exemplary bias conditions applied in the program operation.

Figure 6:
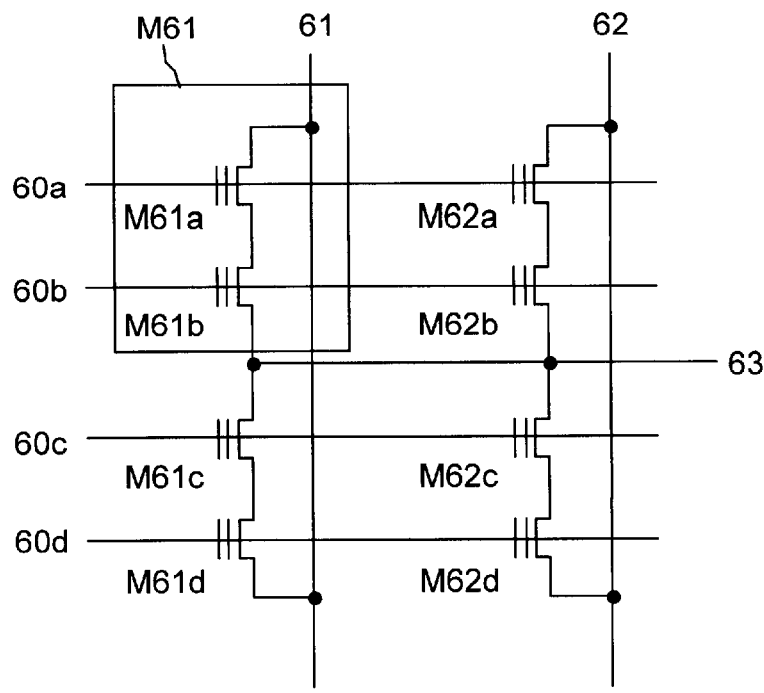
FIG. 6 and TABLE 5 illustrate a third preferred embodiment of the cell structure according to the present invention.

Referring now to FIG. 6, a third preferred embodiment of the cell structure according to the present invention is illustrated. The third embodiment cell M61 also contains a 2T structure M61a and M61b. However, unlike the previous embodiments, this 2T cell contains two Flash transistors M61a and M61b. This approach will provide a double density Flash array in the same area compared with the prior art 2T cell that uses one Flash cell and one select transistor.

More specifically, the memory cell device M61 comprises a first Flash transistor M61a having control gate, flash gate, drain, and source. A second Flash transistor M61b has control gate, flash gate, drain, and source. The first Flash transistor M61a drain is coupled to an array bit line 61. The second Flash transistor M61b source is coupled to an array source line 63. The first Flash transistor M61a source is coupled to the second Flash transistor M61b drain.

TABLE 5 shows a detailed demonstration of the exemplary operating conditions according to the disclosed, third preferred embodiment, cell structure as shown in FIG. 6. The architecture features page-selectable erasing and bit-selectable programming operation. During an erase operation, the selected word line 60a is driven to a positive, high voltage $V_{pp}$ of, for example, about +12V, and the selected bit lines 61 and 62 are driven to a low voltage of, for example, about 0V or to a negative voltage of, for example, about −5V. These bias conditions will cause electrons to be transferred, by F-N tunneling, from the channel regions to the floating gates of the selected cells M61a and M62a. The $V_{th}$ of the selected cells is increased to make the cell data bit '0'. During program operation, the selected word line 60a is driven with a negative, high voltage $V_{nn}$ of, for example, about −8V, and the selected bit line 61 is driven with a positive, medium-high voltage $V_{mp2}$ of, for example, about +5V. These bias conditions cause electrons to transfer, by F-N tunneling, from the floating gate to the bit line junction of the selected cell M61a. The selected cell M61a $V_{th}$ is decreased to a data bit '1.' At the same time, the deselected bit line 62 is driven with a low voltage of, for example, about 0V. The voltage difference between the bit line 62 and the word line 60a is not sufficient to induce F-N tunneling in the deselected cell M62a.

Note that the second Flash cell M61b in the 2T cell structure M61 may be programmed and erased using similar operating conditions. It is obvious that there are many ways to implement the bias conditions for the erase, program, and read operations for the third preferred embodiment cell structure of the present invention.

To read the Flash cell M61, the selected bit line 61 is driven with a proper bias voltage of, for example, about +1V, and is coupled to a current sense, amplifier circuit through the selection of bit line decoding circuitry. The selected source line 63 is driven with a relatively low voltage of, for example, about 0V. The third preferred embodiment, 2T cell M61 contains two Flash cells M61a and M61b. The data bit of both cells can be individually read.

To read the first Flash cell M61a, a proper voltage ($V_{read}$) is applied to the selected word line 60a. This $V_{read}$ voltage has to be able to distinguish the Flash cell $V_{th}$ level. Since the over-erase problem can be ignored, the Flash transistor M61a can have a negative $V_{th}$. A Flash cell storing binary data could have a $V_{th}$ ranging from higher than about +2V to represent data '0' to lower than about −1V to represent data '1'. In this case, a $V_{read}$ voltage of between about −1V and +2V can be applied to the selected word line 60a to check the selected cell M61a $V_{th}$ level. If the cell has a low $V_{th}$, it will be turned ON and will conduct between about 30 uA and 50 uA of current. Otherwise, it will be turned OFF and conduct no channel current. This $V_{th}$ distribution is only an example. The Flash cell can have positive values for both low $V_{th}$ and high $V_{th}$, or negative values for both low $V_{th}$ and high $V_{th}$, or a negative value for low $V_{th}$ and a positive value for high $V_{th}$.

To read the first Flash transistor M61a, the second Flash transistor M61b must be turned ON to allow channel current to flow from the bit line 61 to the source line 63. Therefore, the word line 60b is driven with a proper high voltage ($V_{pass}$) to turn ON the second Flash cell M61b regardless of the second Flash cell $V_{th}$. For example, if the second Flash cell M61b $V_{th}$ is about −1V for low $V_{th}$ level and is about +2V for high $V_{th}$ level, then the word line 60b voltage should be between about +3V and +4V.

Reading the second Flash transistor M61b is similar to reading the first Flash transistor M61a. A proper high voltage ($V_{pass}$) is applied to the first Flash cell M61a word line 60a to turn it ON regardless of the $V_{th}$ level and to allow channel current to flow from the bit line 61 to the source line 63. Similar bias conditions, as mentioned above, are used to read the second Flash cell M61b.

Figure 7A:
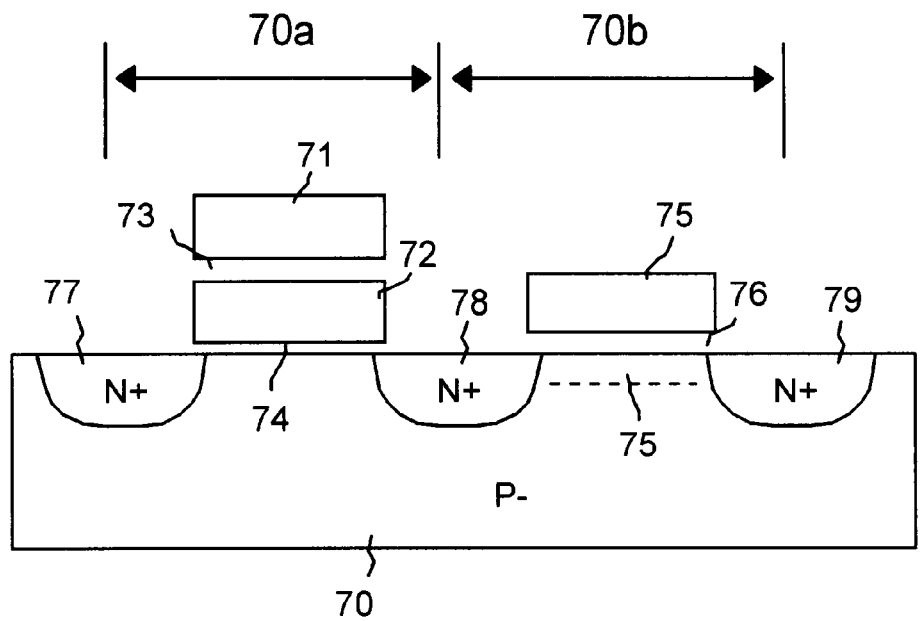
FIG. 7A illustrates a cross-section of the first and second preferred embodiments of the present invention.

Referring now to FIG. 7A a cross-section of the first and second preferred embodiments of the present invention is illustrated. The 2T cell, comprising a Flash transistor 70a and a mask ROM transistor 70b, is shown as a cross-section view along the bit line direction. The Flash cell 70a comprises a control gate 71, a floating gate 72, a dielectric layer 73, a tunnel oxide layer 74, a source 77 and a drain 78. The control gate 71 preferably comprises a polysilicon layer. The floating gate 72 also preferably comprises a polysilicon layer. Alternatively, the floating gate 72 may comprise an insulator layer such as silicon nitride. This would be the case for a MONOS-type device. The dielectric layer 73 is between the control gate 71 and the floating gate 72 and preferably comprises an oxide-nitride-oxide (ONO) film having, for example, a thickness of about 150 Angstroms. The tunnel oxide layer 74 overlies the substrate 70 and comprises a thickness of, for example, about 90 Angstroms. The source 77 and drain 78 preferably comprise heavily doped N+ regions in the P− substrate 70.

The Flash cell 70a and the mask ROM cell 70b are preferably located in a P-type bulk, which can be either a P-substrate, or a P-well inside a deep N-well. During the fabrication process, the mask ROM transistor 70b data bit is programmed by a channel ROM code ion implantation. If, for example, boron is implanted in the channel region 75 of the mask ROM cell 70b, then the cell $V_{th}$ becomes higher and stores a logic '0' data bit. If boron is not implanted, such as when it is blocked by the implanting mask, then the mask ROM cell 70b remains at the intrinsic, low $V_{th}$ of about 0.7V according to current technology. If a negative mask ROM cell $V_{th}$ is required, then phosphorus is implanted in the channel region 75 to decrease the cell $V_{th}$ to become a negative value.

Figure 7B:
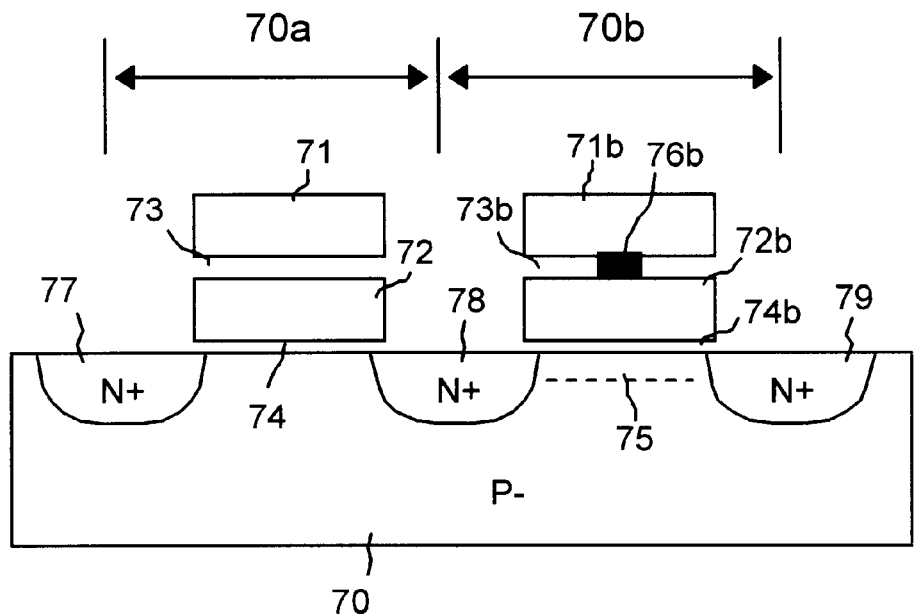
FIG. 7B illustrates an alternative cross section of the first and second preferred embodiments.

Referring now to FIG. 7B, an alternative cross section of the first and second preferred embodiments is shown. In this case, a floating gate device 70b is used to form the mask ROM transistor 70b. By modifying a Flash cell into a mask ROM cell, both devices rely on the same process and the fabrication is simplified. The Flash cell-modified mask ROM cell 70b comprises a control gate 71b, a floating gate 72b, a dielectric layer 73b, and a tunnel oxide layer 74b. To convert from the Flash cell transistor 70a to the mask ROM cell transistor 70b, the control gate 71b and the floating gate 72b are shorted together with a contact 76b, so that the cell becomes a single-gate transistor.

The mask ROM cell 70b data is determined by the $V_{th}$ that is programmed by the channel ROM code ion implantation into the cell channel region 75 as described above for the previous embodiment shown. Note that the ROM code implantation step may take place after the first polysilicon processing steps in order to allow the impurity dose to be implanted through the first polysilicon layer 72b.

Figure 7C:
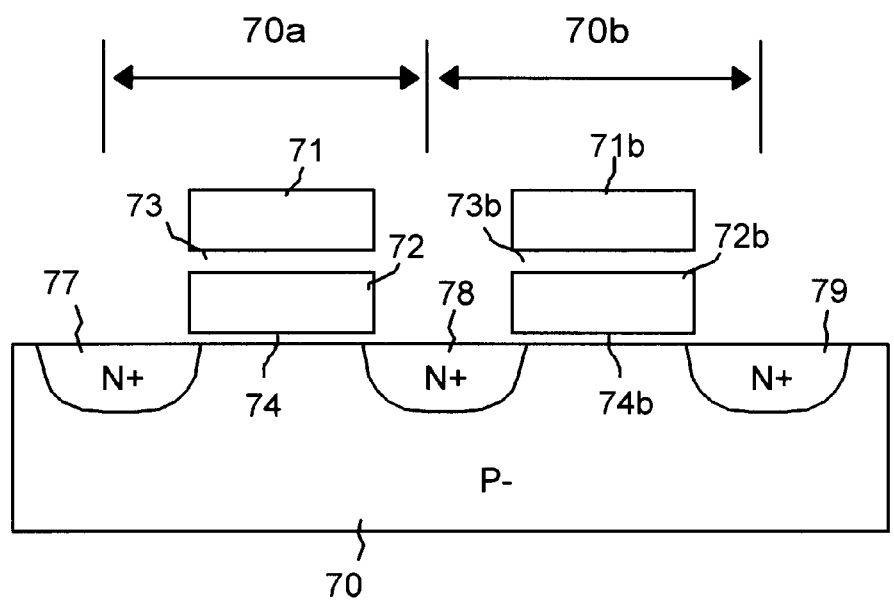
FIG. 7C illustrates a cross-section view along the bit line direction for the third preferred embodiment of the present invention.

Referring now to FIG. 7C, a cross-section view along the bit line direction is shown for the third preferred embodiment of the present invention. In this embodiment, the 2T cell contains two Flash cells 70a and 70b.

Figure 7D:
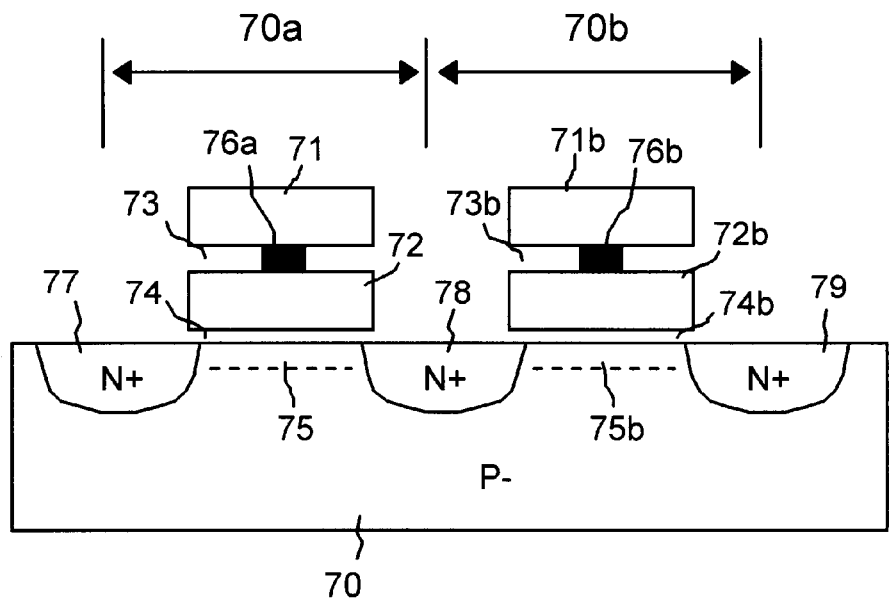
FIG. 7D illustrates a cross-section view along the bit line direction according to the disclosed 2T cell structure.

Referring now to FIG. 7D, a cross-section view along the bit line direction according to the disclosed 2T cell structure is shown. Here, the 2T cell contains two mask ROM cells 70a and 70b and no Flash cells. This embodiment shows how any of the embodiments may be converted to an all mask ROM cell by shorting the floating gates 72 and 72b to their respective control gates 71 and 71b. The contacts 76a and 76b make the cells into single-gate transistors. The cell 70a and 70b data is programmed by the channel ROM code implant in the cell channel region 75 and 75b as described above for the previous embodiment.

Figure 10:
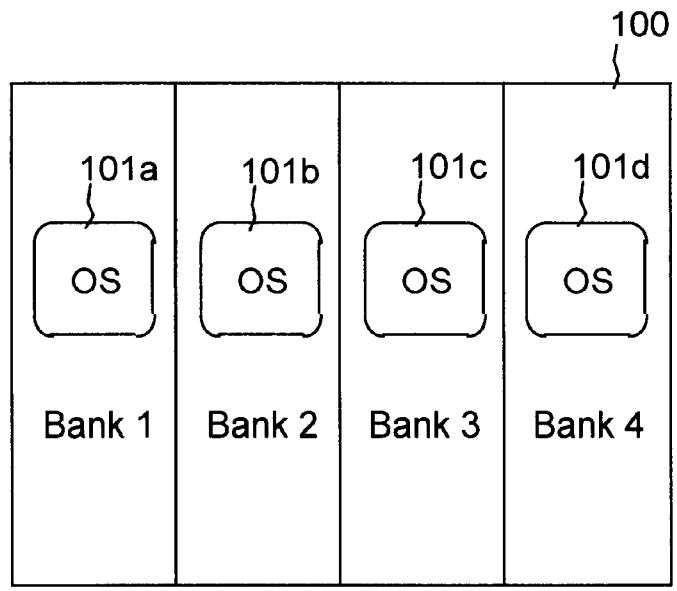
FIG. 10 illustrates an exemplary, conventional 'multi-bank' array architecture.
Figure 11:
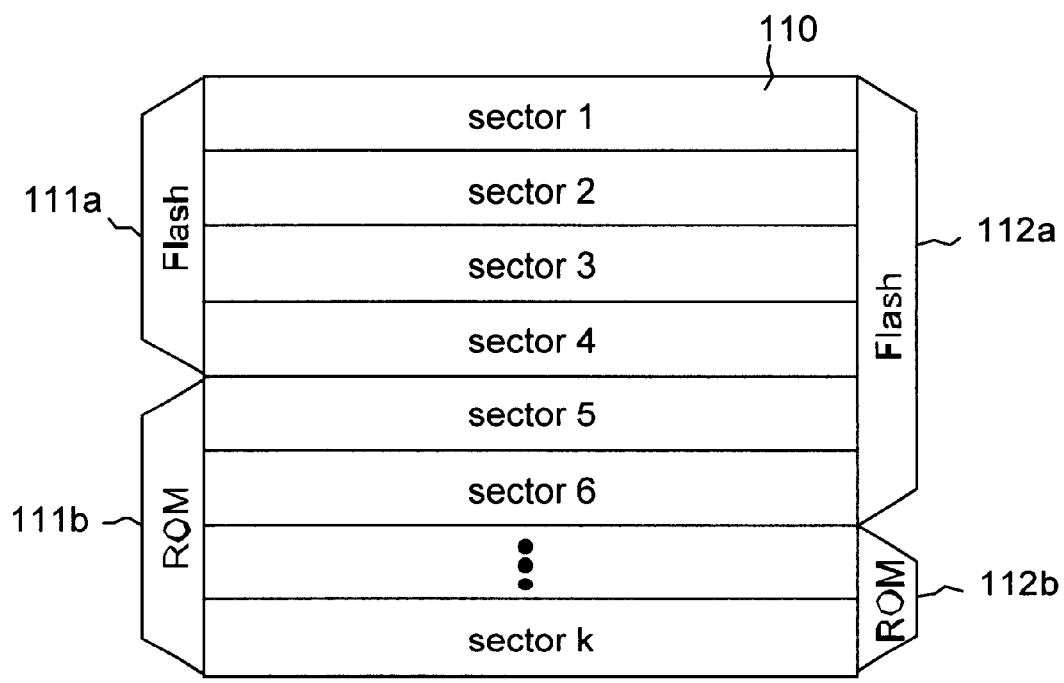
FIG. 11 illustrates an array architecture according to the disclosure of the present invention.
Figure 12:
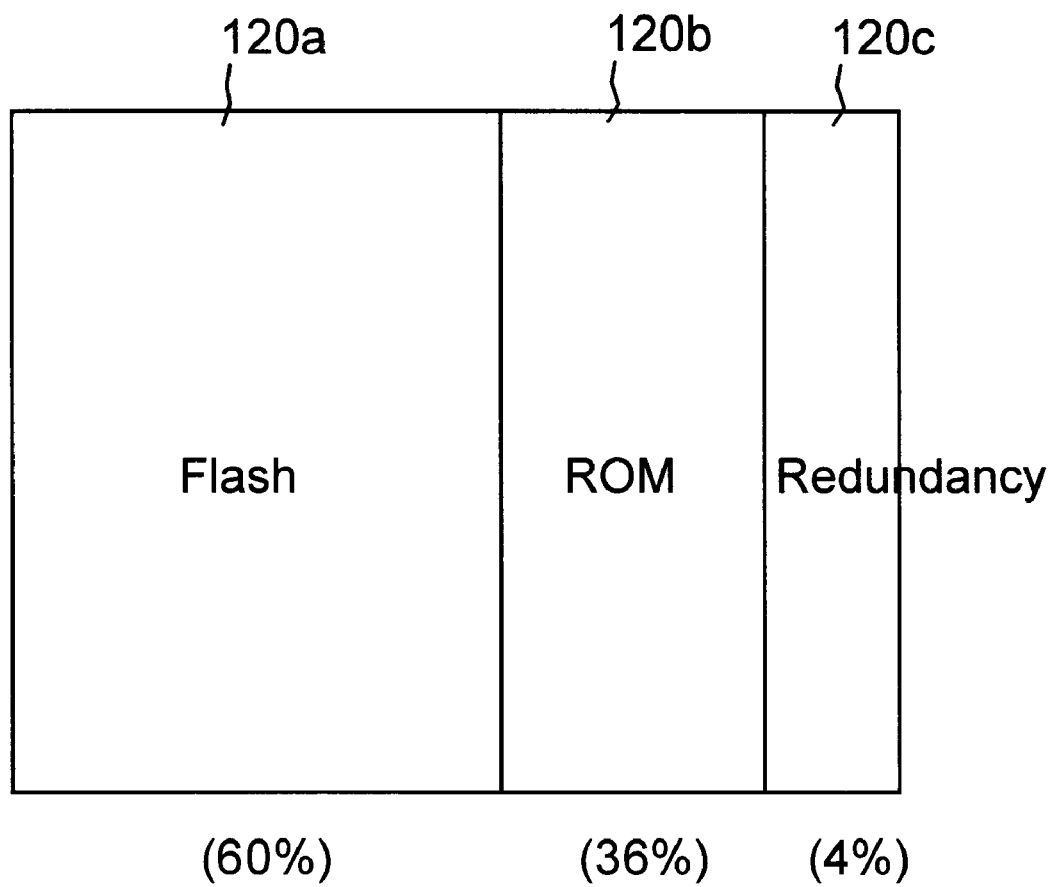
FIG. 12 illustrates another array architecture of the present invention.

Several embodiments of the different cell structures according to the present invention have been fully described and disclosed. In these embodiments, note that the cell structures shown in FIGS. 7B, 7C, and 7D are fully process compatible. These cells provide the capability for building a highly flexible array. The array may comprise portions using cells such shown in FIG. 7B where a Flash transistor is combined with a mask ROM transistor. Other portions of the array may comprise cells shown in FIG. 7C where both transistors are Flash devices. Yet other portions of the array may comprise cells of the embodiment shown in FIG. 7D where both transistors are mask ROM devices. Therefore, by flexibly combining these three process-compatible cell structures, a fixed density array can be partitioned into any density of Flash cells and any density of mask ROM cells. A more detailed description of such an array architecture according to the present invention is shown in FIGS. 10, 11, and 12, and is discussed below.

Figure 8:
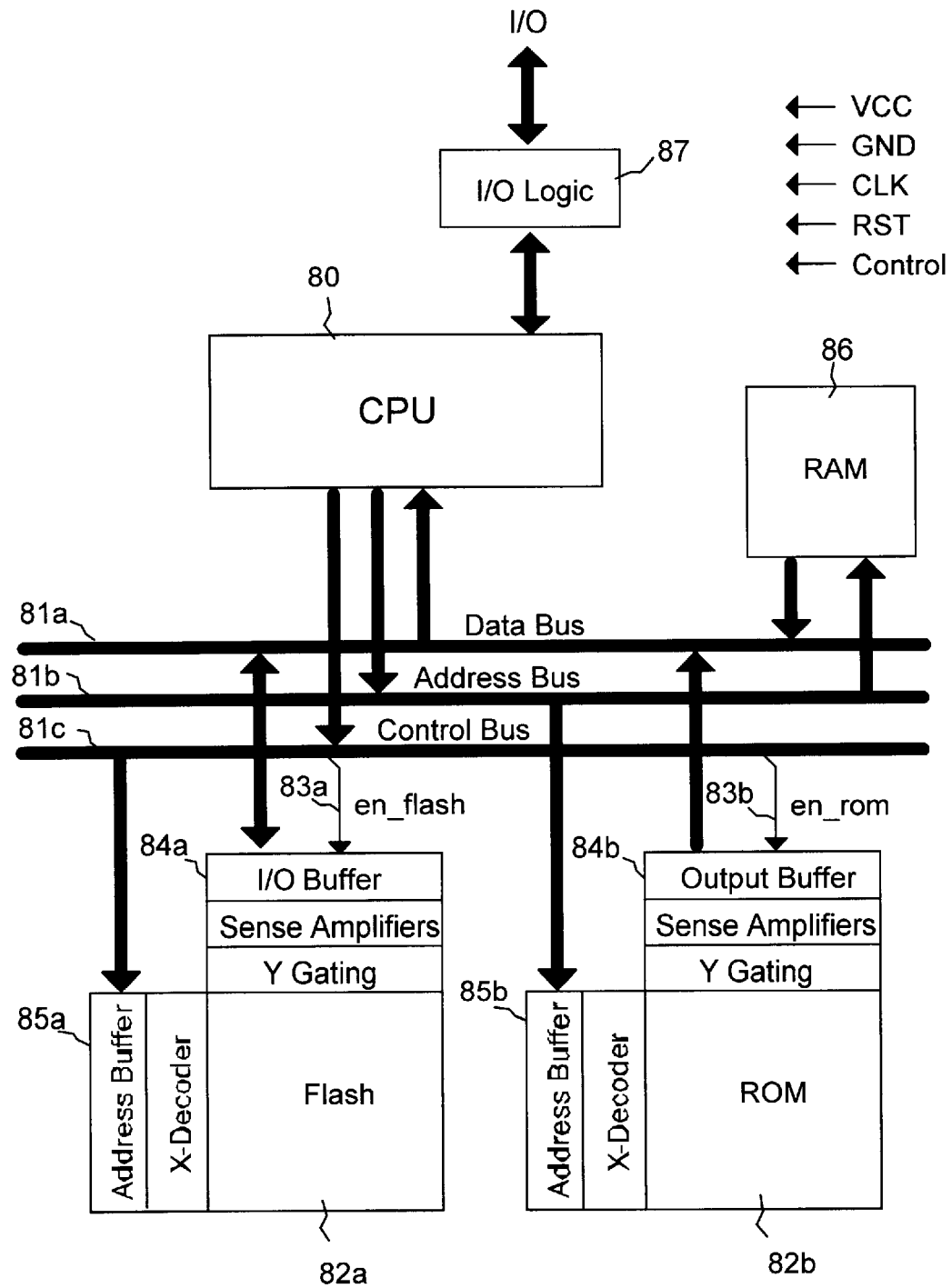
FIG. 8 illustrates an exemplary block diagram of a prior art chip architecture for an embedded application or a smart card application.

Referring now to FIG. 8, an exemplary block diagram of a prior art, chip architecture for an embedded application or a smart card application is shown. This block diagram has been simplified for easier demonstration. As mentioned above, the conventional architecture uses a discrete Flash memory 82a and a discrete ROM 82b. According to the prior art architecture, a CPU 80 is used perform the data processing. This CPU may comprise a microprocessor, or a DSP, or a state machine. A Flash array 82a is used to store variable data or to store application program code. A ROM array 82b is used to store the operating system (OS) or the boot program or the security codes. A RAM 86 is used to perform temporary data storage for the CPU 80. I/O logic 87 is used to perform the data interface between the card and an external device.

The exemplary architecture contains three common buses for data transfer. They are a common data bus 81a, a common address bus 81b, and a common control bus 81c. These buses are shared by the CPU 80, the Flash memory 82a, the ROM 82b, and the RAM 86. The CPU 80 can access the data from any one of the three memories: Flash 82a, ROM 82b, and RAM 86. To access the Flash memory 82a, the CPU 80 first issues an enable signal EN_FLASH 83a to the control bus 81c to enable the Flash memory 82a. Then, the CPU 80 sends the address to the common address bus 81b. Because only the Flash memory 82a is enabled, the address will be sent into the address buffer 85a of the Flash memory 82a to select the location of the requested data. The address is decoded by the X-decoder and Y-gating to select the word line and bit line of the selected cells. The selected cell data then is read by the sense amplifiers and sent out by the I/O buffer 84a of the Flash memory 82a to the common data bus 81a. Then, the CPU 80 will fetch the data from the common data bus 81a.

Similar operations are used to write data into the Flash memory 82a, except that the written data is sent from the CPU 80 to the common data bus 81a, and then into the Flash memory 82a. The Flash memory then performs an internal program operation to store the data.

To read from the ROM 82b, an operation similar to that described above for reading the Flash memory takes place. The CPU 80 issues an enable signal EN_ROM 83b to enable the ROM 82b. The address is sent to the common address bus 81b and fed into the address buffer 85b of the ROM 82b. The requested data then is transferred from the output buffer 84b of the ROM 82b to the common data bus 81a and is fetched by the CPU 80.

The conventional architecture uses one flash memory 82a and one ROM 82b. Therefore, a lot of circuitry and area are duplicated. For example, each Flash memory 82a and ROM 82b requires its own address buffer, X-decoder, Y-gating, sense amplifiers, and I/O buffers. Each memory also requires that the address bus 81b and data bus 81a be routed to connect to the address buffer and output buffer of the Flash memory 82a and ROM 82b. These bus lines typically occupy a lot of silicon area.

Figure 9:
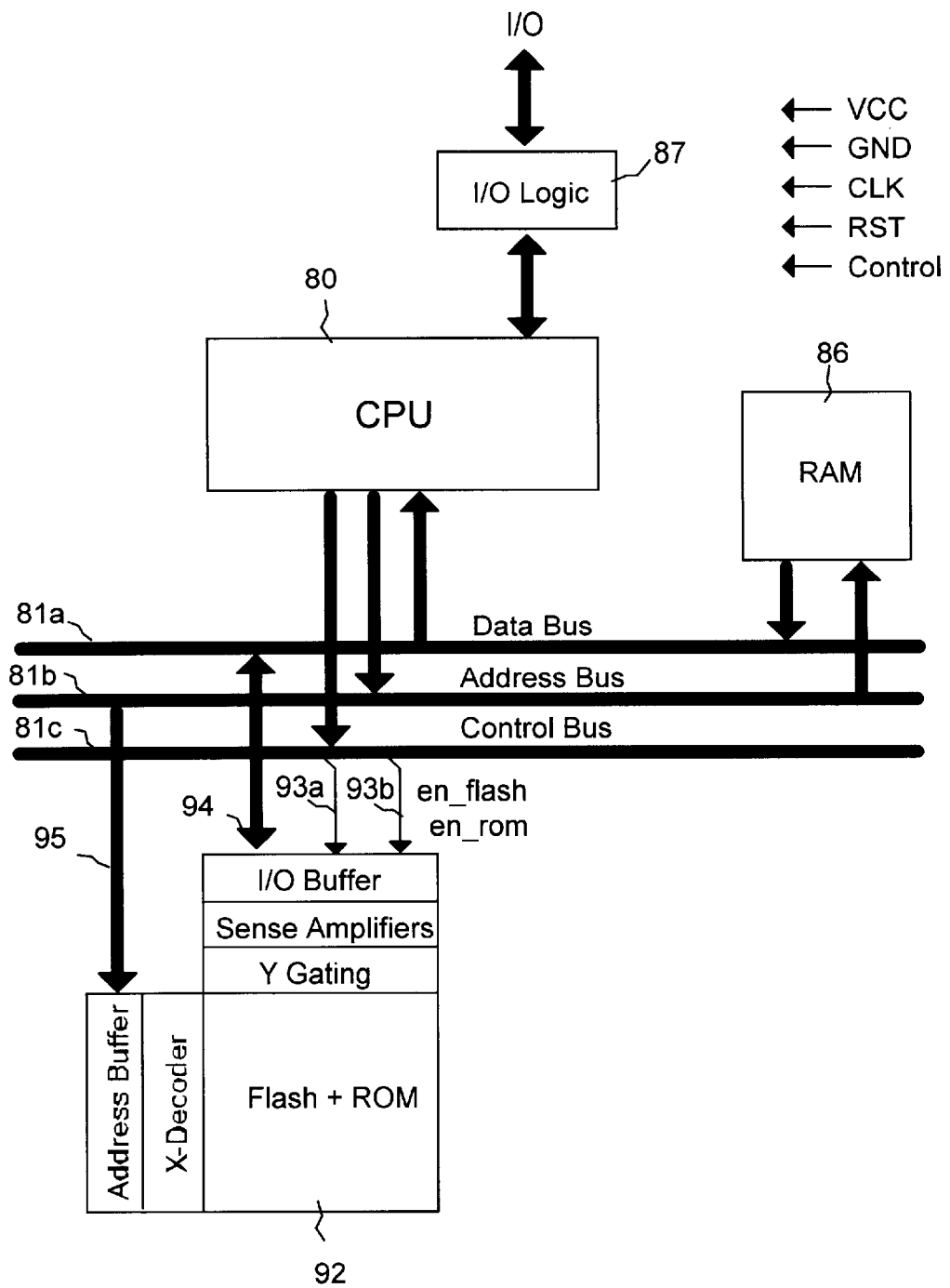
FIG. 9 illustrates a preferred embodiment of a system architecture of the present invention.

Referring now to FIG. 9, a preferred embodiment of a system architecture of the present invention is illustrated. As discussed above, the invention discloses a novel cell structure and array structure to combine the Flash memory and the ROM into one array. Therefore, the two discrete memories can be replaced by a single 'Flash-and-ROM' array 92. The Flash-and-ROM array contains both Flash memory and ROM in the same area of the conventional flash memory only, thus significantly reducing the chip size.

In the Flash-and-ROM array 92, the Flash portion and the ROM portion share the address buffer 95, X-decoder, Y-gating, sense amplifiers, I/O buffer 94, the input address bus and the output data bus. Therefore, the disclosed Flash-and-ROM array can save significant array area and is highly cost-effective. Because the data of the Flash memory and of the ROM are located in the same array and share the same address bus and data bus, two signals, EN_FLASH 93*a* and EN_ROM 93*b* are used to individually enable the Flash portion or the ROM to avoid data conflict. There are several ways to achieve this in the system level or in circuit level. As an alternative, a common enable signal may be used for the entire Flash-and-ROM array (92), but a second, select signal is then used to select the Flash portion or the ROM portion of the array.

More specifically, the system may comprise one of two embodiments depending on the configuration of the combined, Flash-and-ROM array. First, the system may comprise a memory array 92 comprising a plurality of memory cell devices. The memory cell devices comprise a first transistor having gate, drain, and source. A second transistor has gate, drain, and source. The first transistor drain is coupled to an array bit line. The second transistor source is coupled to an array source line. The first transistor source is coupled to the second transistor drain. The first transistor and the second transistor comprise one Flash transistor and one mask ROM transistor. Finally, an access controller 80 is included that is capable of accessing the memory array 92.

Second, the system may comprise a memory array 92 further comprising a plurality of memory cell devices. The memory cell devices comprise a first transistor having gate, drain, and source. A second transistor has gate, drain, and source. The first transistor drain is coupled to an array bit line. The second transistor source is coupled to an array source line. The first transistor source is coupled to the second transistor drain. The first transistor and the second transistor comprise one of the group consisting of: one Flash transistor and one mask ROM transistor, two Flash transistors, and two mask ROM transistors. Finally, an access controller 80 is included that is capable of accessing the memory array 92.

The Flash-and-ROM array of the present invention is suitable for many types of array architectures. The is no constraint regarding a particular array architecture, application, or product.

Referring now to FIG. 10, an exemplary, conventional 'multi-bank' array architecture is illustrated. In this array architecture, the memory array 100 is divided into more than one bank. For example, four banks as shown. Each bank can individually perform the erase, program, or read operations without interrupting other the operation of other banks. For example, the multi-bank architecture allows Bank 1 101*a* to perform an erase operation, while Bank 2 101*b* is performing a program operation, while the Bank 3 101*c* is performing a read operation, and while the Bank 4 101*d* is in standby. This is typically called 'simultaneous-operation' for a Flash memory.

It is obvious that this multi-bank architecture and simultaneous-operation can be also used in the novel Flash-and-ROM array architecture of the present invention. However, for a traditional simultaneous-operation, multi-bank array architecture, there is a significant limitation on storing the operating system (OS). When a bank is performing an erase or program operation, the data in the entire bank will not be able to be read. Although the multiple-bank architecture 100 allows the data in the other banks to be read, it is still not suitable for storing the OS. The OS typically has to be accessed by the CPU at high frequency, Therefore, if the OS is partially located in the bank selected for an erase or a program operation, then the OS is not accessible to CPU.

In the prior art, the OS will to be stored separately from the Flash memory, in a low-frequency, modified memory, typically a ROM array. However, the present invention teaches a combined Flash-and-ROM array where the ROM is integrated into the Flash memory. Therefore, the problem of an inaccessible OS must be solved. To solve this problem, the preferred architecture embodiment stores multiple copies of the OS in the multiple banks 101*a*–101*d*. Therefore, if any bank is selected for erasing and programming, then the CPU can still run the OS program from another bank without slowing the CPU's operating speed.

Referring now to FIG. 11, another array architecture according to the disclosure of the present invention is illustrated. The array 110 is divided into multiple sectors from sector 1 to sector k. The novel, Flash-and-ROM array of the present invention has a significant advantage over the prior art in that the density of the Flash portion and of the ROM portion is highly flexible. In the other words, among the sectors 1 to k, any number of the sectors can be partitioned as Flash cells, and any number of the sectors can be partitioned as ROM cells. This is achieved by using the three different types of cell structures, as disclosed in FIGS. 7B, 7C, and 7D, in different sectors of the array 110. For example, assuming k equals 8, the first exemplary partition on the left side shows sectors 1 through 4 partitioned as Flash memory 111*a* and sectors 5 through 8 partitioned as ROM 111*b*. This results in 50-50 ratio of the Flash portion to ROM portion in the array. Alternatively, a second exemplary partition shows sectors 1 through 6 partitioned as Flash memory 112*a* and sectors 7 through 8 partitioned as ROM 112*b*. This results in 60-20 ratio of the Flash portion to ROM portion in the array.

This novel array architecture provides extremely high flexibility for system and chip designers. In the conventional system, using discrete flash memory and ROM, the density is fixed and cannot be changed even though the stored data size changes. Thus, the conventional approach lacks flexibility and is very difficult to use. By comparison, the present invention brings flexibility and ease of use.

Referring now to FIG. 12, another array architecture of the present invention is shown. In the array architecture, a redundant array 120*c* is added to the Flash partition 120*a* and the ROM partition 120*b*. The redundancy array 120*c* is used to replace defective rows (word lines) and defective columns (bit lines) in the other arrays 120*a* and 120*b*. Therefore, the process yield can be significantly increased. In the conventional discrete flash and ROM system, the Flash memory typically has redundancy but the ROM does not. This is because the traditional ROM has no in-system re-programmability, so it cannot store the address of the defective columns or rows for the redundancy. However, in the novel Flash-and-ROM array of the present invention, the ROM is located with the Flash memory inside a common array. Therefore, a portion of the Flash array can be partitioned to be redundancy for the ROM, and a portion of the Flash array can be partitioned to be redundancy for the Flash memory. In the exemplary array partition, the Flash memory 120*a* occupies 60% of the entire array, the ROM 120*b* occupies 36% of the entire array, and the redundancy 120*c* occupies 4% of the entire array.

Moreover, as mentioned above, because the densities for the Flash 120*a*, ROM 120*b*, and redundancy 120*c* can be freely partitioned in the novel flash-and-ROM array, the redundancy approach is highly flexible. The number of redundancy rows and columns can be optimally partitioned according to the real number of defective rows and columns. Therefore, a 100% repairing rate can be achieved. In addition, because the redundancy is partitioned according to the real required number of defective rows and columns, the redundancy will not create any wasted memory area. In the conventional Flash memory, the array cannot be freely partitioned so a fixed size of redundancy is used. It is obvious that the repairing rate is lower and that a lot of redundancy is simply wasted memory area.

A significant additional advantage of the Flash-and-ROM integrated array of the present invention is area savings. In industrial application, it is highly desirable to find an effective way to quickly convert a Flash memory array into a mask ROM array to save cost and turn-around cycle time. Due to a Flash memory's re-programmability, it is the most widely chosen embedded memory candidate to store the driver, program code, or data code in a development stage of a new product. Therefore, the driver, program code, or data code of the new product can be easily updated to fulfill the market demands. However, as the product development nears completion, the program code or data code needs no further changes. It is then highly desirable to change the embedded memory from Flash memory into a Mask ROM memory, due to the low manufacturing cost of ROM.

Typical Flash memory and Mask ROM have different cell sizes. Therefore, changing the embedded memory requires the re-layout of the entire memory and a new floor plan to fit the Mask ROM array's size into the previous Flash memory array's area. Due to this inconvenience, the product time to market and the product turn-around are slowed. However, for the novel Flash-and-ROM array architecture of the present invention, the Flash memory array, can be easily converted into a standard Mask ROM by eliminating several process steps, such as tunnel-oxide deposition, floating gate polysilicon deposition and pattern etching, and ONO deposition and etching. In addition, the array size will remain the same before and after converting the Flash memory array into Mask-ROM array. Therefore, the original Flash-and-ROM array can be easily turned into an all-Mask-ROM array without any re-layout or floor plan change.

Although N-channel type Flash memory cells are used in the disclosure of the present invention, P-channel type Flash memory cells are obviously applicable to the array architecture and to the erase and programming conditions herein disclosed.

Although silicon-substrate type Flash memory cells are used in the disclosure of the present invention, Silicon-On-Insulator (SOI) type Flash memory cells are obviously also applicable to the array architecture and to the erase and programming conditions herein disclosed.

Although common-well type Flash memory cells are used in the disclosure of the present invention, separated-well type of Flash memory cells are obviously also applicable to the array architecture and to the erase and programming conditions herein disclosed.

Although floating-gate type Flash memory cells are used in the disclosure according of the present invention, other non-floating-gate type of Flash memory cells, such as Metal-Oxide-Nitride-Oxide-Silicon (MONOS) type of flash memory cells, are obviously also applicable to the array architecture and to the erase and programming conditions that are herein disclosed.

Although ground-substrate or ground-P-well conditions are used in the disclosure of the present invention, substrate-bias of, for example, negative substrate or P-well bias voltages of between about −1V and −6V, as used in known 'Channel-Initiated-Secondary-Electron' (CHISEL) injection programming schemes. These schemes are obviously also applicable to the array architecture and to the erase and programming conditions that are disclosed herein.

In summary, a novel array and memory cell architecture that highly integrates the same density of a Flash memory array and a Mask ROM array is fully disclosed herein. Please note that all of the examples in this document are used for demonstration purposes. The voltage levels, the number of $V_{th}$ values, the array architectures, programming mechanism, programming steps, and programming algorithms for the present invention are not constrained by the examples in this document. A person who is skilled in the art will understand the prior art can be applied to different fields while not exceeding the scope of the present invention.

The advantages of the present invention may now be summarized. An effective and manufacturable memory device is provided. The memory device is a highly integrated array of Flash cells and mask ROM cells. The architecture of the array eliminates over-erase problems by integrating a mask ROM transistor with a Flash transistor to create a novel 2T cell. The memory density is doubled by integrating a mask ROM transistor with a Flash transistor. A highly integrated Flash cell and mask ROM cell array is provided that is compatible with a range of programming and erasing mechanisms. A memory device comprising a 2T cell using two Flash transistors is also provided.

As shown in the preferred embodiments, the novel method and circuit of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A memory cell device comprising:
    a first transistor having gate, drain, and source; and
    a second transistor having gate, drain, and source, wherein said first transistor drain is coupled to an array bit line, wherein said second transistor source is coupled to an array source line, wherein said first transistor source is coupled to said second transistor drain, wherein said first transistor and said second transistor comprise one Flash transistor and one mask ROM transistor, and wherein the programmed state of said mask ROM transistor can be read.

2. The device according to claim 1 wherein mask RON transistor can turn OFF bit line current in said memory cell device when said Flash transistor is over-erased.

3. The device according to claim 1 wherein said mask ROM transistor programmed state is determined by an ion implantation.

4. The device according to claim 1 wherein said mask RON transistor comprises a stacked gate, Flash transistor having control gate and floating gate electrodes shorted together.

5. The device according to claim 1 wherein said Flash transistor comprises a stacked gate having a floating gate electrode comprising a conductive layer.

6. The device according to claim 1 wherein said Flash transistor comprises a stacked gate having a floating gate electrode comprising an insulating layer.

7. The device according to claim 1 wherein said Flash transistor is programmed and erased using an F-N tunneling mechanism.

8. The device according to claim 1 wherein said Flash transistor is programmed and erased using a CHE injection mechanism.

9. The device according to claim 1 wherein said Flash transistor is programmed and erased using a CHISEL injection mechanism.

10. A memory cell device comprising:
a first Flash transistor having control gate, flash gate, drain, and source; and
a second Flash transistor having control gate, flash gate, drain, and source, wherein said first Flash transistor drain is coupled to an array bit line, wherein said second Flash transistor source is coupled to an array source line, wherein said first Flash transistor source is coupled to said second Flash transistor drain, wherein said first Flash transistor can turn OFF bit line current in said memory cell device when said second Flash transistor is over-erased and wherein said second Flash transistor can turn OFF bit line current in said memory cell device when said first Flash transistor is over erased.

11. The device according to claim 10 wherein each said Flash transistor comprise a stacked gate having a floating gate electrode comprising a conductive layer.

12. The device according to claim 10 wherein each said Flash transistor comprises a stacked gate having a floating gate electrode comprising an insulating layer.

13. The device according to claim 10 wherein said Flash transistors are programmed and erased using an F-N tunneling mechanism.

14. The device according to claim 10 wherein said Flash transistor are programmed and erased using a CHE injection mechanism.

15. The device according to claim 10 wherein said Flash transistors are programmed and erased using a CHISEL injection mechanism.

16. A device comprising:
a memory array comprising a plurality of memory cell devices, said memory cell devices comprising:
a first transistor having gate, drain, and source; and
a second transistor having gate, drain, and source, wherein said first transistor drain is coupled to an array bit line, wherein said second transistor source is coupled to an array source line, wherein said first transistor source is coupled to said second transistor drain, wherein said first transistor and said second transistor comprise one Flash transistor and one mask RON transistor, and wherein the programmed state of said mask RON transistor can be read; and
an access controller capable of accessing said memory array.

17. The device according to claim 16 wherein said access controller comprises a central processing unit capable of executing programs contained in said memory array.

18. The device according to claim 16 wherein said memory array is divided into banks of said memory cells and wherein an operating system program is contained in each of said banks.

19. The device according to claim 16 wherein mask ROM transistor can turn OFF bit line current in said memory cell device when said Flash transistor is over-erased.

20. The device according to claim 16 wherein said mask ROM transistor programmed state is determined by an ion implantation.

21. The device according to claim 16 wherein said mask ROM transistor comprises a stacked gate, Flash transistor having control gate and floating gate electrodes shorted together.

22. The device according to claim 16 wherein said Flash transistor comprises a stacked gate having a floating gate electrode comprising a conductive layer.

23. The device according to claim 16 wherein said Flash transistor comprises a stacked gate having a floating gate electrode comprising an insulating layer.

24. The device according to claim 16 wherein said Flash transistor is programmed and erased using an F-N tunneling mechanism.

25. The device according to claim 16 wherein said Flash transistor is programmed and erased using a CHE injection mechanism.

26. The device according to claim 16 wherein said Flash transistor is programmed and erased using a CHISEL injection mechanism.

27. A device comprising:
a memory array comprising a plurality of memory cell devices, said memory cell devices comprising:
a first transistor having gate, drain, and source; and
a second transistor having gate, drain, and source, wherein said first transistor drain is coupled to an array bit line, wherein said second transistor source is coupled to an array source line, wherein said first transistor source is coupled to said second transistor drain, wherein said first transistor and said second transistor comprise one of the group consisting of: one Flash transistor and one mask RON transistor, two Flash transistors, and two mask ROM transistors, and wherein the programmed state of said mask ROM transistor can be read; and
an access controller capable of accessing said memory array.

28. The device according to claim 27 wherein said access controller comprises a central processing unit capable of executing programs contained in said memory array.

29. The device according to claim 27 wherein said memory array is divided into banks of said memory cells and wherein an operating system program is contained in each of said banks.

30. The device according to claim 27 wherein said mask RON transistor programmed state is determined by an ion implantation.

31. The device according to claim 27 wherein said mask RON transistor comprises a stacked gate, Flash transistor having control gate and floating gate electrodes shorted together.

32. The device according to claim 27 wherein said Flash transistor is programmed and erased using an F-N tunneling mechanism.

33. The device according to claim 27 wherein said Flash transistor is programmed and erased using a CHE injection mechanism.

34. The device according to claim 27 wherein said Flash transistor is programmed and erased using a CHISEL injection mechanism.

35. The device according to claim 27 wherein said memory array is partitioned into sectors and wherein each said sector comprises one of the group consisting of: Flash cells and mask ROM cells.

36. The device according to claim 35 further comprising grouping a portion of said sectors into a redundancy array.

* * * * *